US010917067B2

(12) United States Patent
Li et al.

(10) Patent No.: US 10,917,067 B2
(45) Date of Patent: *Feb. 9, 2021

(54) RF SIGNAL AMPLIFIER WITH COMBINED ACTIVE AND PASSIVE PORT

(71) Applicant: CommScope, Inc. of North Carolina, Hickory, NC (US)

(72) Inventors: Shi Man Li, Mooresville, NC (US); Mark O. Vogel, Statesville, NC (US)

(73) Assignee: CommScope, Inc. of North Carolina, Hickory, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/367,865

(22) Filed: Mar. 28, 2019

(65) Prior Publication Data
US 2019/0312561 A1    Oct. 10, 2019

Related U.S. Application Data

(60) Provisional application No. 62/655,743, filed on Apr. 10, 2018.

(51) Int. Cl.
| | | |
|---|---|---|
| *H04L 12/66* | (2006.01) | |
| *H03H 7/46* | (2006.01) | |
| *H04N 21/61* | (2011.01) | |
| *H03H 7/01* | (2006.01) | |
| *H03F 3/62* | (2006.01) | |

(52) U.S. Cl.
CPC ............. *H03H 7/463* (2013.01); *H03F 3/62* (2013.01); *H03H 7/0138* (2013.01); *H04N 21/6118* (2013.01)

(58) Field of Classification Search
CPC ..... H04L 5/04; H04L 5/08; H04L 5/06; H04L 5/14; H04L 12/12; H03F 3/189; H03F 3/62; H03F 2200/451; H03F 2200/63; H03H 7/01; H03H 7/0138; H03H 7/46; H03H 7/463; H04N 7/173; H04N 7/17309; H04N 21/61; H04N 21/6118; H04N 21/6168
See application file for complete search history.

(56) References Cited

U.S. PATENT DOCUMENTS

| | | |
|---|---|---|
| 6,957,047 B1 | 10/2005 | Young et al. |
| 6,980,643 B2 | 12/2005 | Chen et al. |
| 7,912,431 B2 | 3/2011 | Phillips et al. |
| 7,974,586 B2 | 7/2011 | Romerein et al. |

(Continued)

OTHER PUBLICATIONS

Tyco Electronics, Niu, Network Interface Unit, Advertisement, 2005, Tyco Electronics Raychem NV, Diestsesteenweg 692, 3010 Kessel-Lo Belgium.

(Continued)

*Primary Examiner* — Frank Duong
(74) *Attorney, Agent, or Firm* — Muncy, Geissler, Olds & Lowe, P.C.

(57) ABSTRACT

The present invention is directed to a bi-directional RF signal amplifier that includes both an active communications path and a passive communications path. The circuitry is simplified and the housing size is reduced by having one port which functions as part of the active communications path when the bi-directional RF signal amplifier is powered, and that functions as part of the passive communications path when the bi-directional RF signal amplifier is unpowered.

19 Claims, 6 Drawing Sheets

(56) References Cited

U.S. PATENT DOCUMENTS

| | | | |
|---|---|---|---|
| 8,397,271 B2* | 3/2013 | Riggsby | H04N 7/102 |
| | | | 725/143 |
| 8,479,247 B2* | 7/2013 | Shafer | H04B 3/36 |
| | | | 370/464 |
| 8,510,782 B2* | 8/2013 | Wells | H04L 12/2801 |
| | | | 348/342 |
| 8,971,792 B2 | 3/2015 | Riggsby et al. | |
| 9,686,698 B2 | 6/2017 | Riggsby et al. | |
| 9,819,369 B2 | 11/2017 | Li et al. | |
| 2005/0026571 A1 | 2/2005 | Yang et al. | |
| 2005/0068223 A1 | 3/2005 | Vavik | |
| 2006/0015921 A1 | 1/2006 | Vaughan | |
| 2006/0205442 A1* | 9/2006 | Phillips | H03F 3/72 |
| | | | 455/572 |
| 2006/0232357 A1 | 10/2006 | Roldan et al. | |
| 2007/0165611 A1 | 7/2007 | Yang et al. | |
| 2008/0112392 A1 | 5/2008 | Mansfield | |
| 2009/0047917 A1 | 2/2009 | Phillips et al. | |
| 2010/0052974 A1 | 3/2010 | Corbe et al. | |
| 2010/0162340 A1 | 6/2010 | Riggsby | |
| 2011/0283331 A1 | 11/2011 | Riggsby | |
| 2013/0343245 A1 | 12/2013 | Li et al. | |
| 2018/0007313 A1* | 1/2018 | Bailey | H04N 7/104 |

OTHER PUBLICATIONS

Three Block Diagrams of Units Sold by CommScope/Tyco Electronics prior to Jan. 1, 2017.

* cited by examiner

RF SIGNAL AMPLIFIER WITH COMBINED ACTIVE AND PASSIVE PORT

This application claims the benefit of U.S. Provisional Application No. 62/655,743, filed Apr. 10, 2018, which is herein incorporated by reference.

BACKGROUND OF THE INVENTION

1. Field of the Invention

The present invention is directed to a bi-directional RF signal amplifier that includes both an active signal path a passive signal path. More particularly, the present invention relates a bi-directional RF signal amplifier having at least one port that is part of the active signal path when the bi-directional RF signal amplifier is powered, and that is part of the passive signal path when the bi-directional RF signal amplifier is unpowered.

2. Description of the Related Art

Cable television ("CATV") networks are known types of communications networks that are used to transmit information between a service provider and a plurality of subscriber premises, typically over fiber optic and/or coaxial cables. The service provider may offer, among other things, cable television, broadband Internet and Voice-over-Internet Protocol ("VoIP") digital telephone service to subscribers within a particular geographic area. The service provider transmits "forward path" or "downstream" signals from the headend facilities of the cable television network to the subscriber premises. "Reverse path" or "upstream" signals may also be transmitted from the individual subscriber premises back to the headend facilities. In the United States, the forward path signals are typically transmitted in the 54-1,002 MHz frequency band, and may include, for example, different tiers of cable television channels, movies on demand, digital telephone and/or Internet service, and other broadcast or point-to-point offerings. The reverse path signals are typically transmitted in the 5-42 MHz frequency band and may include, for example, signals associated with digital telephone and/or Internet service and ordering commands, i.e., for movies-on-demand and other services.

Each subscriber premises typically includes one or more power divider networks that are used to divide the downstream signals received from the service provider, so that the downstream signals may be fed to a plurality of service ports, such as wall outlets that are dispersed throughout the subscriber premises. These power divider networks also combine upstream signals that may be transmitted from one or more of the service ports into a composite upstream signal that is transmitted over the CATV network back to the headend facilities, e.g., in the 5-42 MHz frequency band.

A recent trend is to use the coaxial cables that are installed throughout most homes, apartments and other subscriber premises as an "in-premises" or "in-home" network that may be used to transmit signals from a first end device that is connected to a first wall outlet in a subscriber premises to other end devices that are connected to other wall outlets in the same subscriber premises. An industry alliance known as the Multi-media Over Coax Alliance ("MoCA") has developed standards which specify frequency bands, interfaces and other parameters that will allow equipment from different standards-compliant vendors to be used to distribute multi-media content over such in-premises coaxial cable networks. These standards specify that such "MoCA" content is transmitted over the in-premises coaxial cable networks in the 400 MHz to 1,675 MHz frequency band, although some service providers only distribute MoCA content within a narrower frequency band that is above the cable television band, such as, for example, the 1,125 MHz to 1,675 MHz frequency band. Thus, the MoCA content is transmitted over the in-premises network in a pre-selected MoCA frequency band. The power divider network in the in-premises network may be designed to support communications between its output ports in this pre-selected MoCA frequency band.

Examples of MoCA content that may be distributed over an in-premises coaxial cable network are digital television, video-on-demand programming and digitally-recorded television or music programming. In an exemplary application, such programming may be transmitted via the in-premises network of a home from a primary set-top box (which may be a full service set top box having a digital television receiver, DVR and/or video-on-demand capabilities, etc.) to less capable, less expensive, auxiliary set-top boxes that are installed on other televisions throughout the premises or directly to televisions, DVD players, etc. with MoCA ports. In this manner, the full capabilities of the primary set top box may be enjoyed at all of the televisions within the residence without having to provide a primary set top box for each television.

Also, it is known to connect a gateway device to the downstream/upstream CATV signal, and then connect the gateway device to other devices, such as laptop computers, desktop computers, TVs, monitors, security cameras, intercoms, internet interface assistants, wireless light controllers, etc., via the MoCA ports using the in-premises network.

In many cases, significant attenuation may occur as signals are passed through the cable television network of a service provider, and hence the power level of the RF signal that is received at a subscriber premises may be on the order of 0-5 dBmV/channel. Such received signal levels may be insufficient to support the various services at an acceptable quality of service level. Accordingly, an RF signal amplifier may be provided at or near an entrance point of an individual subscriber's premises. The RF signal amplifier is used to amplify the downstream RF signals to a more useful level. The RF signal amplifier may also be configured to amplify the upstream RF signals that are transmitted from the subscriber premises to the headend facilities of the cable television network. Typically, the RF signal amplifiers are incorporated into the power divider network as the first unit, which takes the form of a powered bi-directional RF signal amplifier with an input port for receiving a coaxial cable from the service provider side and plural output ports which receive coaxial cables connected to the various service ports, such as the wall outlets that are dispersed throughout the subscriber's premises.

In accordance with the known power divider network unit, a RF signal amplifier receives a composite downstream RF signal of approximately 5 dBmV/channel in the range of approximately 54-1,002 MHz comprising information for telephone, cable television (CATV), Internet, VoIP, and/or data communications from a service provider. The RF signal amplifier may increase this downstream signal to a more useful level of approximately 20 dBmV/channel at each output port of the unit and pass the amplified downstream signal to one or more devices in communication with the RF signal amplifier through connections to the various coaxial wall outlets. Such devices may include, but need not be limited to: televisions, modems, telephones, computers, and/or other communications devices known in the art. In the event of power failure, unamplified signals may still be passed (in both directions) through a passive communications path between the service provider and at least one communications device.

FIG. 1 illustrates a high level schematic of a bi-directional RF signal amplifier 100 according to the background art. More information concerning the bi-directional RF signal amplifier 100 can be found in the Assignee's U.S. Pat. No. 9,699,516, granted Jul. 4, 2017, the entire contents of which are herein incorporated by reference.

The RF signal amplifier 100 includes a plurality of RF output ports 181-188 that may be used to pass downstream and upstream signals between a service provider and multiple communications devices located in the subscriber premises when the RF signal amplifier is powered and operating normally. Moreover, RF signal amplifier 100 further includes a non-interruptible RF output port 189 that may be used to maintain bi-directional RF communications even during power outages.

As shown in FIG. 1, RF signal amplifier 100 includes a bi-directional RF input port 105 for receiving downstream RF signals from a service provider, or any other appropriate signal source. RF input port 105 can also pass upstream signals in the reverse direction from the RF signal amplifier 100 to the service provider. Due to the bi-directional nature of communications through RF signal amplifiers, it will be appreciated that an "input" port will act as an "output" port and an "output" port will act as an "input" port if the direction of signal flow is reversed. Consequently, it will be appreciated that the terms "input" and "output" are used herein solely for purposes of distinguishing various ports from one another, and are not used to require a direction of signal flow.

As noted above, RF signal amplifier 100 further includes a plurality of bi-directional output ports 181-189 that may be used to pass downstream RF signals from the RF signal amplifier 100 to one or more devices in communication with the output ports 181-189, and to receive upstream RF signals from those devices so that they may be passed through the RF signal amplifier 100 to the service provider. It will be appreciated that any appropriate device that may advantageously send and/or receive an RF signal may be placed in communication with one or more of the various output ports 181-189. For example, it is contemplated that telephone, CATV, Internet, VoIP, and/or data communication devices may be placed in such communication with a service provider where the RF signal amplifier 100 is installed in the residence of a subscriber. However, it will further be appreciated that any desired combination of these and/or other devices may be used where appropriate.

Signals received through RF input port 105 can be passed through RF signal amplifier 100 via an active communications path 114 that extends between RF input port 105 and RF output ports 181-188. Specifically, the downstream signals that are received at RF input port 105 from the service provider are passed to a passive directional coupler 110 that has a first output port that connects to the active communications path 114 and a second output port that connects to a passive communications path 118. The directional coupler 110 splits downstream RF signals onto the active communications path 114 and the passive communications path 118. It will be appreciated that the directional coupler 110 may either evenly or unevenly split the power of the downstream signals between the communications paths 114, 118, depending on the design of the overall circuit. The active communications path 114 amplifies at least one of downstream signals from the service provider to the subscriber premises or upstream signals from the subscriber premises to the service provider. The passive communications path 118 acts as a "non-interruptible" communications path that has no active components thereon, which allows downstream and/or upstream signals to traverse the passive communications path 118 even if a power supply to the RF signal amplifier 100 is interrupted. In some embodiments, the passive communications path 118 may provide a communications path for VoIP telephone service that will operate even during power outages at the subscriber premises (assuming that the modem and/or telephone, as necessary, are powered by a battery backup unit).

As is further shown in FIG. 1, downstream signals traversing the active communications path 114 pass from the first output of directional coupler 110 to an input port 109 of a switching device such as, for example, an SPDT non-latching relay 120. A first output 122 of the relay 120 is connected to an input of a high/low diplexer 130. A second output 124 of the relay 120 is connected to a resistor 126, such as a 75 ohm resistor connected between the second output 124 and ground.

The diplexer 130 separates the high frequency downstream signal from any low frequency upstream signals incident in the reverse direction. In various embodiments, diplexer 130 can filter the signals in a manner such that signals with frequencies greater than approximately 45-50 MHz are passed as high frequency downstream signals, while signals with frequencies lower than such range are passed in the reverse direction as low frequency upstream signals received from ports 181-188. It will be appreciated, however, that other diplexer designs may be utilized.

The high frequency downstream signals filtered by diplexer 130 can be amplified by individual power amplifier 140, and passed through a second high/low diplexer 150 to a MoCA rejection filter 160. MoCA rejection filter 160 attenuates any frequencies in the MoCA frequency range. Typically, no signals in the downstream direction will contain MoCA frequencies and hence the downstream signal will be unaffected.

Next, the downstream signal passes to an input 169 of a power divider network 170. The power divider network 170 splits the downstream signal so that it may be distributed to each of ports 181-188. In the embodiment of FIG. 1, the power divider network 170 includes a power divider 171 in a first tier, feeding power dividers 172 and 173 in a second tier, feeding power dividers 174, 175, 176 and 177 in a third tier. The first, second and third tiers form a pyramid structure. While the power divider network 170 illustrated in FIG. 1 splits the downstream signals for distribution to eight different ports, it will be appreciated that the power divider network 170 may split the downstream signals for distribution to different numbers of ports (e.g., four, six, ten, etc.).

Turning now to the reverse (upstream) signal flow through the active communications path 114 of RF signal amplifier 100, upstream signals received by the RF signal amplifier 100 from devices in communication with ports 181-188 are passed to power divider network 170 where they are combined into a composite upstream signal. This composite upstream signal is fed out of input 169 through the MoCA rejection filter 160. The MoCA rejection filter 160 attenuates frequencies in the MoCA frequency range so as to prevent the MoCA signaling, which freely traverses between the ports 181-188, from entering the high/low diplexer 150. The high/low diplexer 150 separates the low frequency composite upstream signal from any high frequency downstream signals incident in the forward direction. As previously discussed in relation to diplexer 130, the diplexer 150 can filter the signals such that signals with frequencies greater than approximately 45-50 MHz are passed in the forward direction as high frequency downstream signals, while signals with frequencies lower than such range are passed in the reverse direction as low frequency upstream signals received from ports 181-188.

The composite low frequency upstream signal, filtered by diplexer 150, can be passed directly to high/low diplexer 130 (or optionally the upstream signal, filtered by the diplexer 150, can pass through an upstream power amplifier 142 prior to reaching the diplexer 130), where it is then passed through the first output port 122 of the non-latching SPDT relay 120 to the first output port of the directional coupler 110. The directional coupler 110 combines the upstream signal received at output port 122 with any upstream signal received from the passive communications path 118 and passes this combined signal to the RF input port 105 for output to a service provider or other entity in communication with RF input port 105.

The power amplifiers 140 and 142 that are included on the active communications path 114 are active devices that must be powered via a power source, such as a DC linear regulator 195 that outputs a power supply voltage VCC. During normal operation, the RF signal amplifier 100 can be powered from a power input port 190 and/or power that is reverse fed through one of the RF output ports (e.g., output port 188, which is labeled "VDC IN"). In a typical installation at a subscriber premises, it is contemplated that RF signal amplifier 100 may be powered by an AC/DC adapter receiving power provided by the residence (for example, 100-240 VAC, 50/60 Hz). As illustrated in FIG. 1, the power received from either power input port 190 or power input 188 may be provided to the DC voltage regulator 195, which supplies an operating voltage VCC to the power amplifiers 140 and 142 and the relay 120.

In the event that power to the DC voltage regulator 195 is interrupted, DC voltage regulator 195 will be unable to provide operating voltage VCC to power amplifiers 140 and 142 and relay 120. Consequently, during power outages, the downstream portion (and also the upstream portion, if the upstream power amplifier 142 is employed) of the active communications path 114 will be lost, and the relay 120 will connect the resistor 126 to the first output of directional coupler 110.

As noted above, RF signal amplifier 100 also has the passive communications path 118 that extends from the second output of the directional coupler 110 to the passive port 189. This passive communications path 118 bypasses the power amplifiers 140 and 142 and does not include any active components. Consequently, the passive communications path 118 will remain available to pass communications between RF input port 105 and passive port 189, even when the power supply to RF signal amplifier 100 is interrupted. Accordingly, the passive communications path 118 is also referred to as a "non-interruptible" communications path. The passive communications path 118 may be used to maintain essential services to the subscriber premises such as, for example, 911 emergency lifeline services, even during power outages, so long as the subscriber has a battery backup for the necessary devices connected to port 189.

The passive communications path 118 is connected to the active communications path 114 at the input 169 of the power divider network 170. Within the passive communications path 118, upstream signals from the passive port 189 pass into an input 168 of a diplexer 162. Signals in the MoCA frequency range exit the diplexer 162 via output 164 and pass to the active communications path 114 directly upstream of the power divider network 170. By this arrangement, MoCA signals from the passive port 189 may enter the input 169 of the power divider network 170. Hence, MoCA signals may be passed between all of the devices connected to ports 181-189.

The signals from the passive port 189 which pass into the input 168 of a diplexer 162, which are in the high/low frequency range for downstream and upstream communication with the service provider exit the diplexer 160 via output 166 and pass to the second output of the directional coupler 110, where the signals are combined with the signals on the active communications path 114 and are then passed to the RF input port 105.

Additional background art can be found in U.S. Pat. Nos. 3,676,744; 6,969,278; 7,310,355; 7,530,091; 8,695,055; 8,752,114; 8,810,334; 9,167,286; 9,209,774; 9,356,796 and 9,516,376, and in US Published Application Nos. 2005/0044573; 2006/0205442; 2008/0120667; 2008/0148325; 2009/0320086; 2013/0081096 and 2015/0288920, which are herein incorporated by reference.

SUMMARY OF THE INVENTION

The Applicant has appreciated some drawbacks in the RF signal amplifier 100 of FIG. 1.

The Applicant has appreciated that the circuit of FIG. 1 may be simplified so that nine output ports 181-189 are not needed to supply eight active output ports and one passive output port.

The Applicant has appreciated that one of the active ports 181-188 may serve a dual function and be both an active port when power is present and a passive port when power is absent.

The Applicant has appreciated that by adding a second switching device to the circuitry of FIG. 1, many circuit elements may be eliminated, such as the directional coupler 110, the resistor 126, the circuit link between terminals 164 and 169. Further, the diplexer 162 may be replaced with a simple filter, or in other embodiments fully eliminated as well. Such modifications may result in a bi-directional signal amplifier which is cheaper to manufacture and/or is smaller both in circuitry and housing design.

In alternative embodiments, fewer elements in the circuitry of the prior art may be eliminated while still maintaining overall functionality and many of the benefits of the present invention.

Moreover, one less port needs to be formed on the housing of the bi-directional RF signal amplifier, which leads to a reduced cost and space savings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limits of the present invention, and wherein.

DETAILED DESCRIPTION OF EMBODIMENTS OF THE INVENTION

Figure 1:
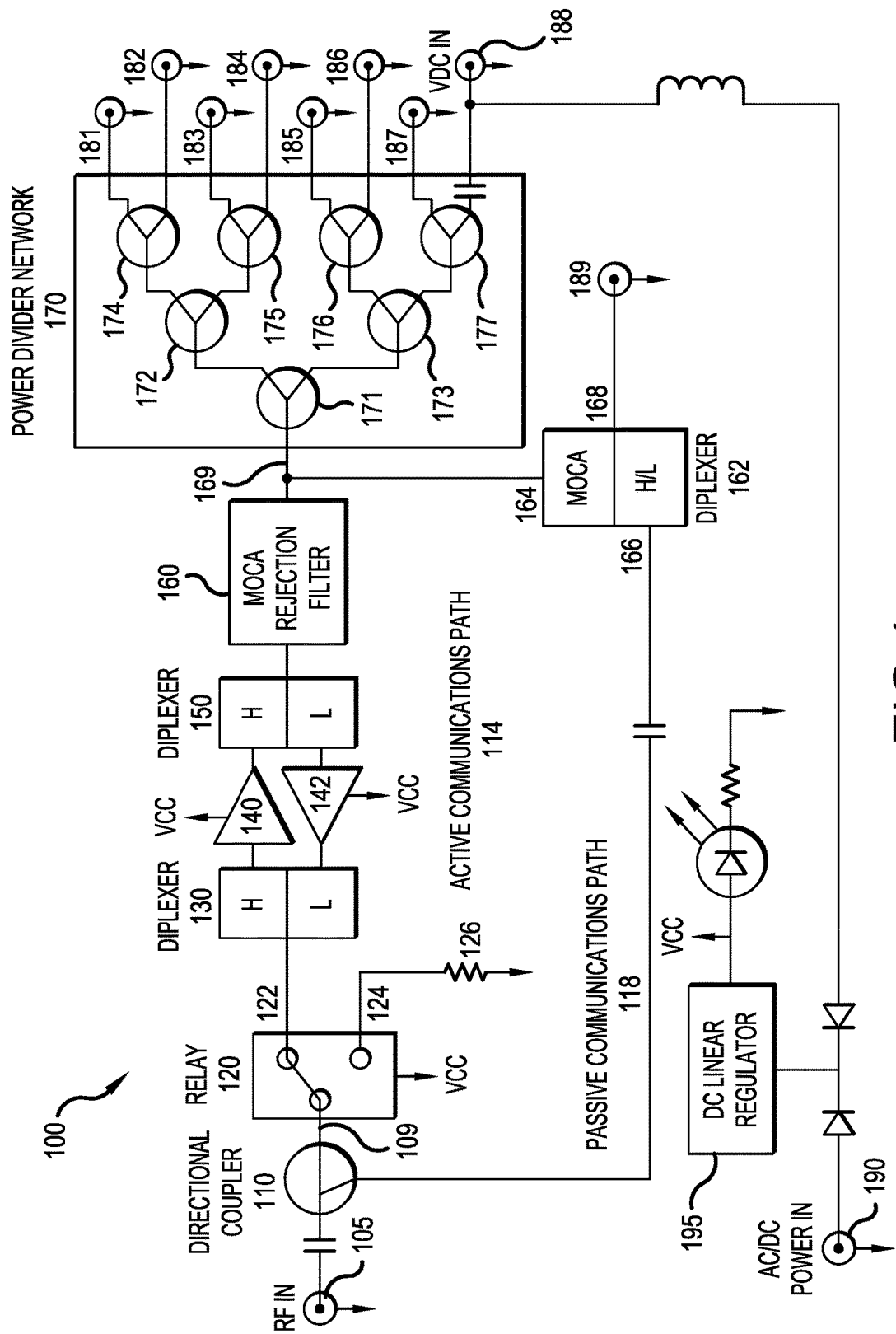
FIG. 1 is a high level schematic of a bi-directional RF signal amplifier, in accordance with the background art.

The present invention now is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity. Broken lines illustrate optional features or operations unless specified otherwise.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

Figure 2:
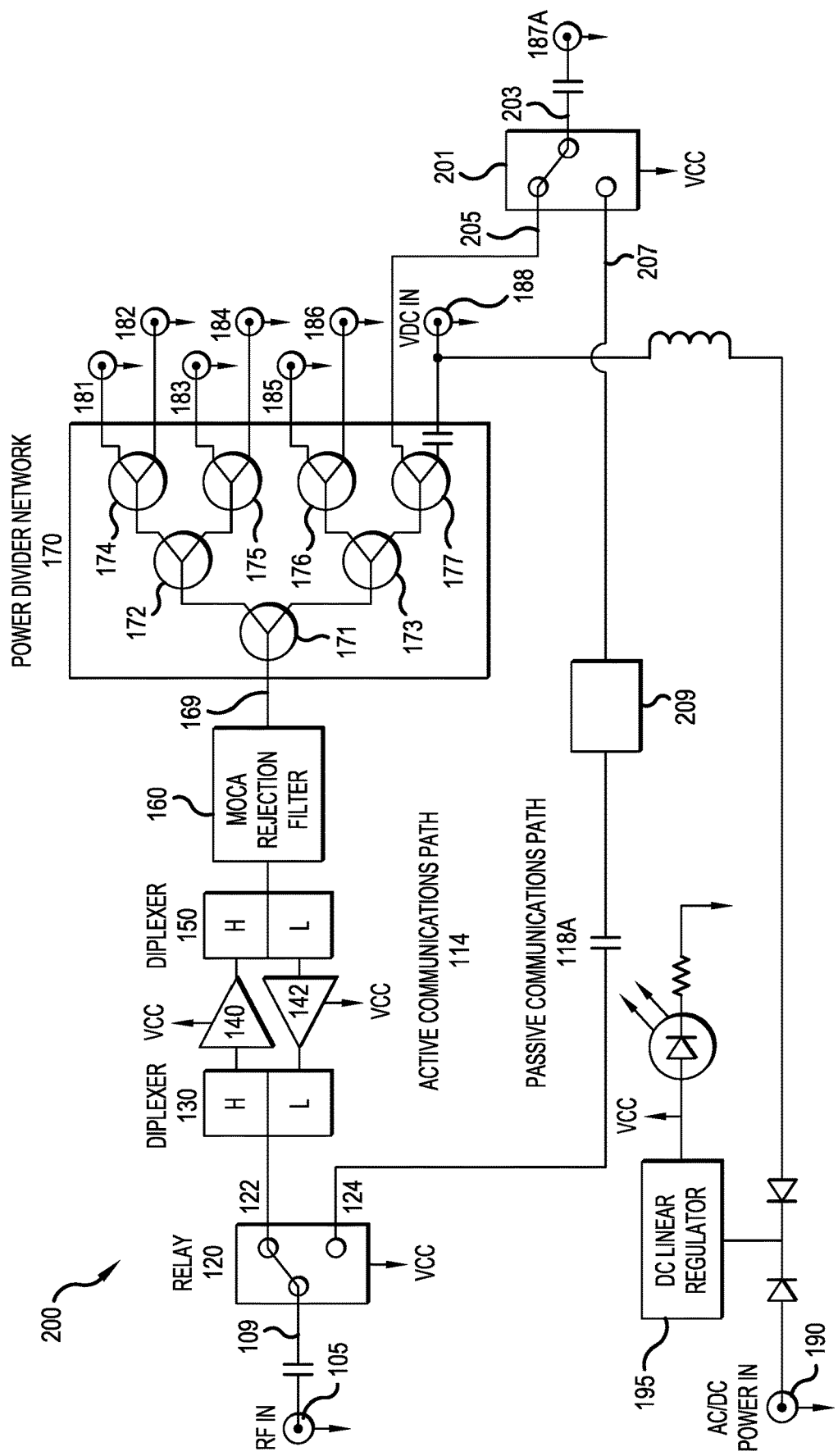
FIG. 2 is a high level schematic of a bi-directional RF signal amplifier, in accordance with a first embodiment of the present invention.

FIG. 2 is a high level schematic of a bi-directional RF signal amplifier 200, in accordance with a first embodiment of the present invention. Elements which are the same or similar to the elements of FIG. 1 have been labeled with a same reference numeral, and the description of those elements, as provided for FIG. 1, is herein incorporated.

Similar to FIG. 1, the bi-directional RF signal amplifier 200 includes a RF input port 105 and a power divider network 170 having at least one power divider 171, 172, 173, 174, 175, 176 and 177. The power divider network 170 has a plurality of outputs, each respectively coupled to one of a plurality of RF output ports 181, 182, 183, 184, 185, 186, 187A and 188. In a preferred embodiment, the plurality of RF output ports 181, 182, 183, 184, 185, 186, 187A and 188 are formed as female coaxial ports.

An active communications path 114 connects the RF input port 105 to the power divider network 170. The active communications path 114 includes at least one power amplifier 140 and 142. A first switch 120, such as a non-latching relay, is located between the RF input port 105 and the active communications path 114. The first switch 120 has a first terminal 109 coupled to the RF input port 105, a second terminal 122 coupled to the active communications path 114, and a third terminal 124.

A passive communications path 118A is coupled to the third terminal 124 of the first switch 120 and also coupled to one of the plurality of RF output ports 181, 182, 183, 184, 185, 186, 187A and 188. In FIG. 2, the passive communications path 118A is coupled to the seventh output port 187A. As shown in FIG. 2, the passive communications path 118A does not pass through said power divider network 170, and does not include any power amplifier.

When power is supplied to the first switch 120, the first terminal 109 of the first switch 120 is connected to the second terminal 122 of the first switch 120. When power is not supplied to the first switch 120, the first terminal 109 of the first switch 120 is connected to the third terminal 124 of the first switch 120.

The active communications path 114 includes the first diplexer 130 and the second diplexer 150. At least one power amplifier 140 and/or 142, e.g., the downstream power amplifier 140, is located between the first diplexer 130 and the second diplexer 150.

A first diplexer 130 has a common port, a high frequency port and a low frequency port. Also, a second diplexer 150 has a common port, a high frequency port and a low frequency port. The second terminal 122 of the first switch 120 is directly coupled to the common port of the first diplexer 130 without any intervening circuit element. An input to the power amplifier 140 is directly coupled to the high frequency port of the first diplexer 130, and an output of the power amplifier 140 is directly coupled to the high frequency port of the second diplexer 150.

A second switch 201 is located between the passive communications path 118A and the one of the plurality of RF output ports 187A. The second switch 201 has a first terminal 203 coupled to the one of the plurality of RF output ports 187A, a second terminal 205 coupled to an output of the power divider network 170 and a third terminal 207 coupled to the passive communications path 118A. When power is supplied to the second switch 201, e.g., VCC, the first terminal 203 of the second switch 201 is connected to the second terminal 205 of the second switch 201. When power is not supplied to the second switch 201, e.g., VCC=zero volts, the first terminal 203 of the second switch 201 is connected to the third terminal 207 of the second switch 201.

A first filter 160, functioning as a MoCA rejection filter, is coupled between the power divider network 170 and the RF input port 105. More particularly, the first filter 160 is coupled between the power divider network 170 and the active communications path 114. A second filter 209, functioning as a MoCA rejection filter, is coupled between the third terminal 207 of the second switch 201 and the third terminal 124 of the first switch 120.

The circuitry of FIG. 2 will enable the output port 187A to be an active port when power, e.g., VCC, is supplied to the circuitry. When power is lost, e.g., during a power outage due to fire or weather, the first and second switches 120 and 201 automatically change contact positions, e.g., under a spring bias. In the first switch 120, contact is made between the first terminal 109 and the third terminal 124, and in the second switch 201, contact is made between the first terminal 203 and the third terminal 207. Under this circumstance, the output port 187A becomes a passive port. Therefore, the user may use a battery backed-up VoIP phone to place emergency calls.

Figure 3:
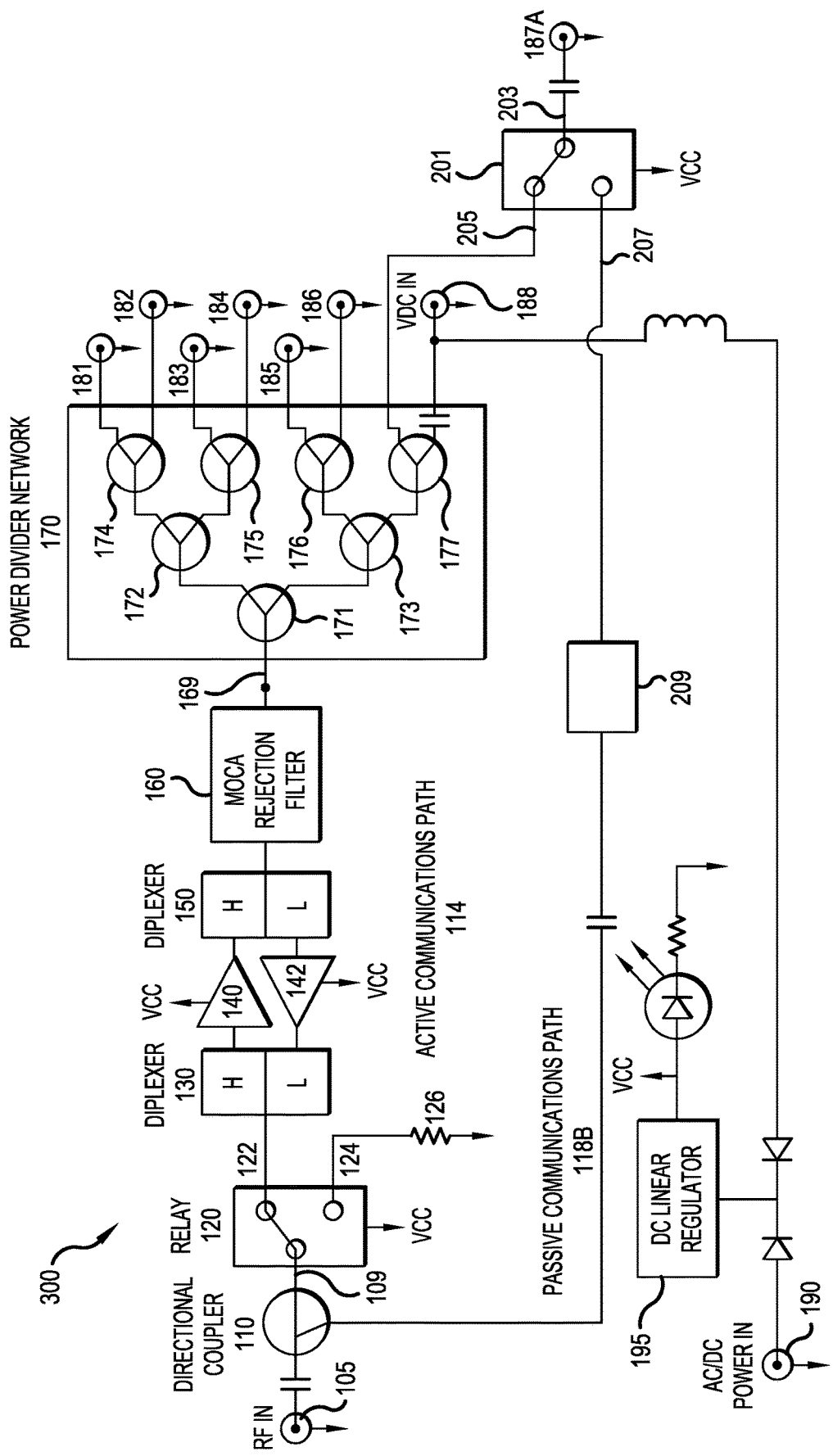
FIG. 3 is a high level schematic of a bi-directional RF signal amplifier, in accordance with a second embodiment of the present invention.

FIG. 3 is a high level schematic of a bi-directional RF signal amplifier 300, in accordance with a second embodiment of the present invention. Elements which are the same or similar to the elements of FIGS. 1 and 2 have been labeled with the same reference numerals, and the description of those elements, as provided for FIGS. 1 and 2, is herein incorporated.

Similar to FIG. 2, the bi-directional RF signal amplifier 300 includes a RF input port 105 and a power divider network 170 having at least one power divider 171, 172, 173, 174, 175, 176 and 177. The power divider network 170 has a plurality of outputs, each respectively coupled to one of a plurality of RF output ports 181, 182, 183, 184, 185, 186, 187A and 188. In a preferred embodiment, the plurality of RF output ports 181, 182, 183, 184, 185, 186, 187A and 188 are formed as female coaxial ports.

An active communications path 114 connects the RF input port 105 to the power divider network 170. The active communications path 114 includes at least one power amplifier 140 and 142. A first switch 120, such as a non-latching relay, is located between the RF input port 105 and the active communications path 114. The first switch 120 has a first terminal 109 coupled to the RF input port 105, a second terminal 122 coupled to the active communications path 114, and a third terminal 124. The third terminal 124 of the first switch 120 is connected to a resistor 126, which is in turn connected to ground.

A directional coupler 110 has first, second and third terminals. The first terminal of the directional coupler 110 is connected to the RF input port 105. The second terminal of the directional coupler 110 is connected to the first terminal 109 of the first switch 120. A passive communications path 118B couples the RF input port 105 to one of the plurality of RF output ports 187A. More particularly, the third terminal of the directional coupler 110 is connected to the passive communications path 118B. As shown in FIG. 3, the passive communications path 118B does not pass through said power divider network 170, and does not include any power amplifier.

When power is supplied to the first switch 120, the first terminal 109 of the first switch 120 is connected to the second terminal 122 of the first switch 120. When power is not supplied to the first switch 120, the first terminal 109 of the first switch 120 is connected to the third terminal 124 of the first switch 120.

A first diplexer 130 has a common port, a high frequency port and a low frequency port. Also, a second diplexer 150 has a common port, a high frequency port and a low frequency port. The second terminal 122 of the first switch 120 is directly coupled to the common port of the first diplexer 130 without any intervening circuit element. An input to the power amplifier 140 is directly coupled to the high frequency port of the first diplexer 130, and an output of the power amplifier 140 is directly coupled to the high frequency port of the second diplexer 150.

The active communications path 114 includes the first diplexer 130 and the second diplexer 15. At least one power amplifier 140 and/or 142, e.g., the downstream power amplifier 140, is located between the first diplexer 130 and the second diplexer 150.

A second switch 201 is located between the passive communications path 118B and the one of the plurality of RF output ports 187A. The second switch 201 has a first terminal 203 coupled to the one of the plurality of RF output ports 187A, a second terminal 205 coupled to an output of the power divider network 170 and a third terminal 207 coupled to the passive communications path 118B. When power is supplied to the second switch 201, e.g., VCC, the first terminal 203 of the second switch 201 is connected to the second terminal 205 of the second switch 201. When power is not supplied to the second switch 201, e.g., VCC=zero volts, the first terminal 203 of the second switch 201 is connected to the third terminal 207 of the second switch 201.

A first filter 160, functioning as a MoCA rejection filter, is coupled between the power divider network 170 and the RF input port 105. More particularly, the first filter 160 is coupled between the power divider network 170 and the active communications path 114. A second filter 209, functioning as a MoCA rejection filter, is coupled between the third terminal 207 of the second switch 201 and the third terminal of the directional coupler 110.

The circuitry of FIG. 3 will enable the output port 187A to be an active port when power, e.g., VCC, is supplied to the circuitry. When power is lost, e.g., during a power outage due to fire or weather, the first and second switches 120 and 201 automatically change contact positions, e.g., under a spring bias. In the first switch 120, contact is made between the first terminal 109 and the third terminal 124, and in the second switch 201, contact is made between the first terminal 203 and the third terminal 207. Under this circumstance, the output port 187A becomes a passive port. Therefore, the user may use a battery backed-up VoIP phone to place emergency calls.

In FIG. 3, the first switch 120 provides a matched termination to the second terminal of the directional coupler 110, e.g., 75 ohms, when power is lost. The matched termination allows the circuitry of FIG. 3 to act normally. If the matched termination were not provided, the unpowered amplifiers 140 and 142 could introduce unpredictable impedances, noise and signal losses to the circuitry of FIG. 3, which might impair the emergency communications taking place along the passive communications path 118B.

Figure 4:
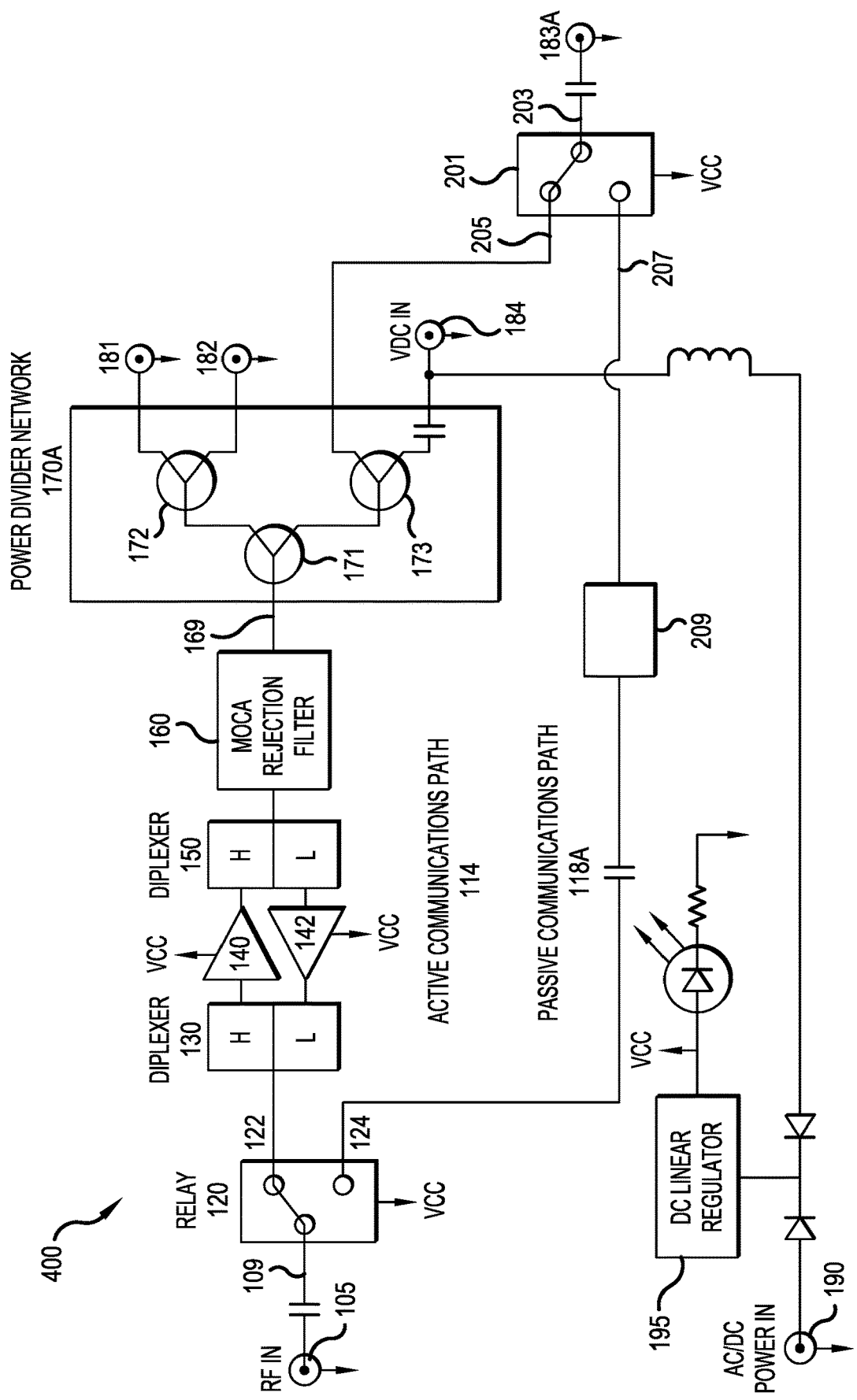
FIG. 4 is a high level schematic of a bi-directional RF signal amplifier, in accordance with a third embodiment of the present invention.

FIG. 4 is a high level schematic of a bi-directional RF signal amplifier 400, in accordance with a third embodiment of the present invention. The third embodiment is identical to the first embodiment of the present invention shown in FIG. 2, except that the power divider network 170 has been replaced with a power divider network 170A, and the one of the plurality of RF output ports 183A is now the third RF output port.

FIG. 4 demonstrates that the power divider network 170A need not have eight outputs coupled to eight RF output ports 181, 182, 183, 184, 185, 186, 187A and 188. FIG. 4 shows four outputs of the power divider network 170A coupled to four RF output ports 181, 182, 183A and 184. All other functionality remains the same as the description given in conjunction with FIG. 2.

Figure 5:
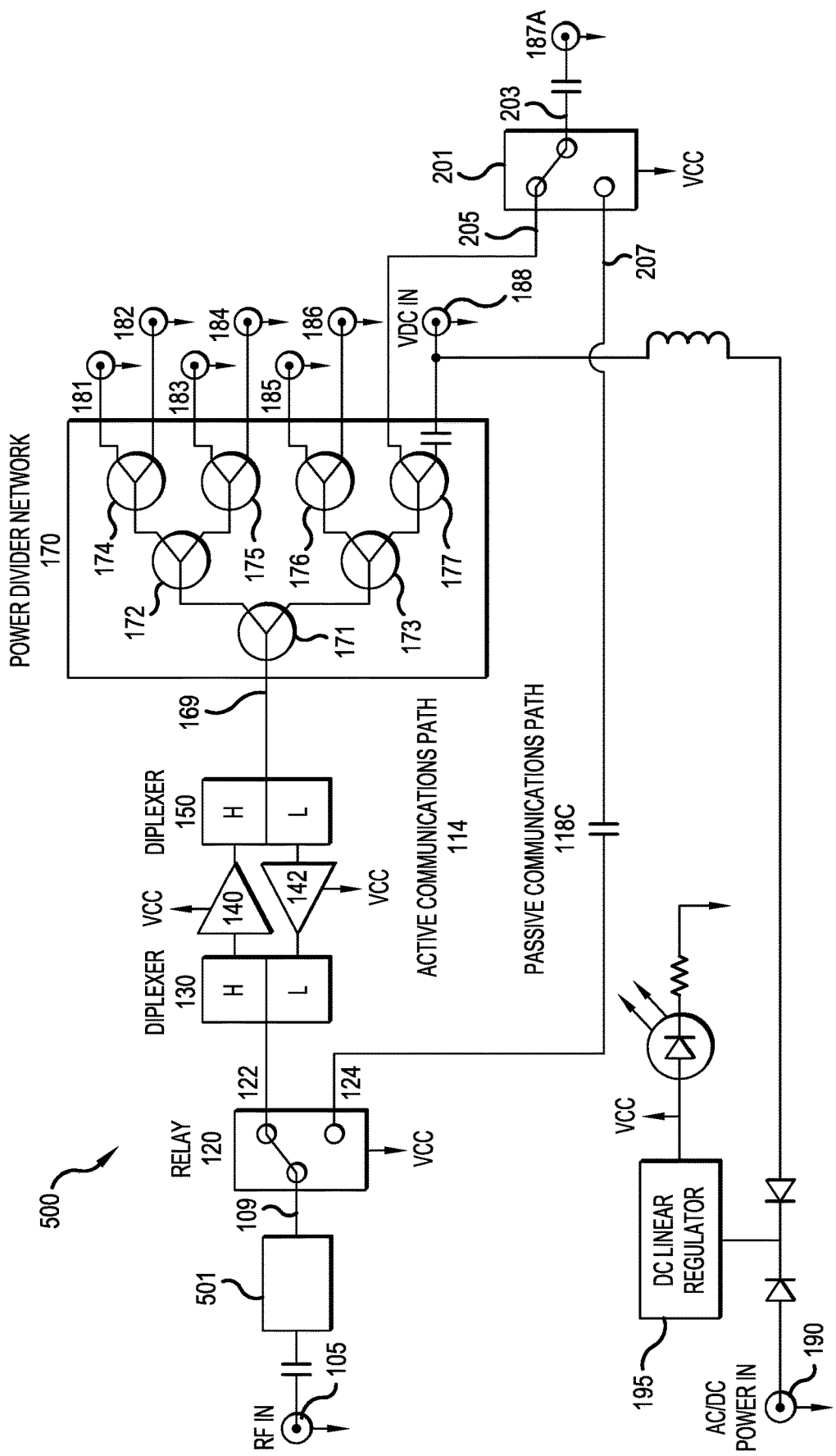
FIG. 5 is a high level schematic of a bi-directional RF signal amplifier, in accordance with a fourth embodiment of the present invention.

FIG. 5 is a high level schematic of a bi-directional RF signal amplifier 500, in accordance with a fourth embodiment of the present invention. The fourth embodiment is exactly the same of as the first embodiment of FIG. 2, except the first filter 160 and the second filter 209 are removed and a new, single "MoCA blocking" filter 501 is coupled between the first terminal 109 of the first switch 120 and the RF input port 105. The fourth embodiment demonstrates an additional cost saving potential over the first embodiment of FIG. 2.

Figure 6:
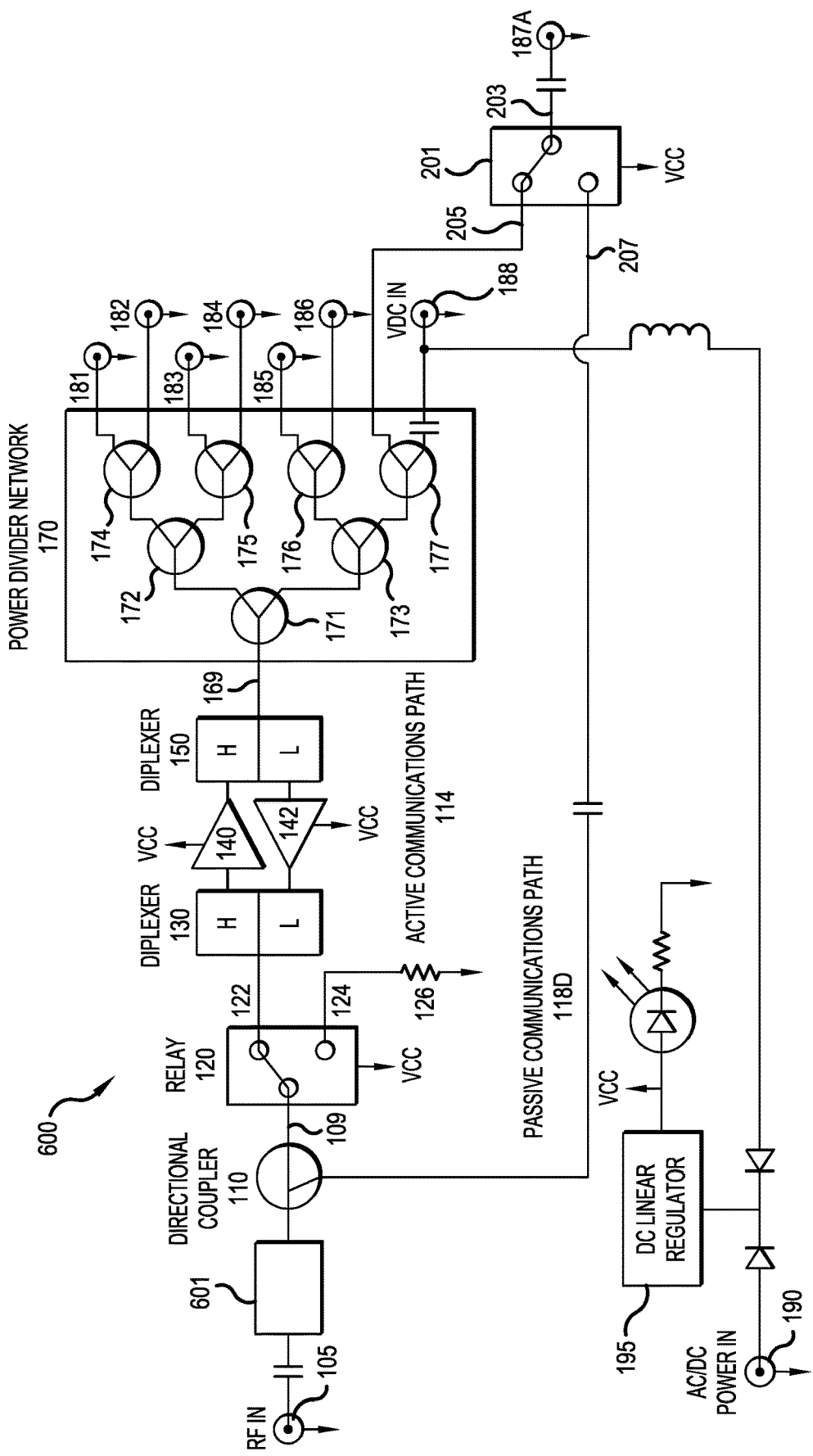
FIG. 6 is a high level schematic of a bi-directional RF signal amplifier, in accordance with a fifth embodiment of the present invention.

FIG. 6 is a high level schematic of a bi-directional RF signal amplifier 600, in accordance with a fifth embodiment of the present invention. The fifth embodiment is exactly the same of as the second embodiment of FIG. 3, except the first filter 160 and the second filter 209 are removed and a new, single "MoCA blocking" filter 601 is coupled between the first terminal of the directional coupler 110 and the RF input port 105. The fifth embodiment demonstrates an additional cost saving potential over the second embodiment of FIG. 3.

The MoCA rejection filters 160, 209, 501 and/or 601 may be notch filters designed to block MoCA frequencies in the range between about 1,125 MHz to about 1,675 MHz, if desired. Alternatively, the MoCA rejection filters 160, 209, 501 and/or 601 may be low pass filters designed to block frequencies above about 1,125 MHz.

The directional coupler 110 of FIGS. 3 and 6 may provide very low attenuation between the first terminal of the directional coupler 110 and the second terminal of the directional coupler 110, and low attenuation between the first terminal of the directional coupler 110 and the third terminal of the directional coupler 110. For example, the signal may be split from the first terminal relative to the second/third terminals in the range of 70/30 or 60/40. The attenuation between the second terminal of the directional coupler 110 and the third terminal of the directional coupler 110 may be significant, e.g., 30 db to 60 db, such as 40 db to 50 db.

Although the above embodiments have illustrated a bi-directional RF signal amplifier 200, 300, 400, 500 and 600 having female coaxial ports, it would be possible to have ports with different configurations, e.g., ¼ plug sockets, female BNC connectors.

Although the power divider networks 170 and 170A of the various embodiments have been illustrated with interconnected power dividers, e.g., 171, 172 and 173, each with two output legs formed into a tree or pyramid structure, the power divider networks 170 and 170A may be formed with more or fewer power dividers. Further, each power divider need not include only two output legs, as three or more output legs may be provided. Further, the structure of the power dividers, within the power divider networks 107 and 170a need not be in a symmetrical tree or pyramid structure, or any type of tree or pyramid structure.

Although the above embodiments have detailed the features of bi-directional RF signal amplifiers 200, 300, 400, 500 and 600 with eight output ports or four output ports, the bidirectional RF signal amplifiers 200, 300, 400, 500 and 600 could have more or fewer output ports. Although the bi-directional RF signal amplifiers 200, 300, 400, 500 and 600 are shown with output ports which are enabled to transmit and receive CATV frequency signals, as well as MoCA signals, the bi-directional RF signal amplifiers 200, 300, 400, 500 and 600 may optionally include one or more ports designated to transmit and receive "MoCA only" signals. It should also be noted that the bi-directional RF signal amplifiers 200, 300, 400, 500 and 600 also encompass devices commonly referenced by other names, such as active gateways.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

The invention claimed is:

1. A bi-directional RF signal amplifier comprising:
   a RF input port;
   a power divider network having at least one power divider leading to a plurality of outputs from said power divider network;
   a plurality of RF output ports, each RF output port coupled to a respective one of said plurality of outputs from said power divider network;
   an active communications path connecting said RF input port to said power divider network, said active communications path including a power amplifier;
   a switch located between said RF input port and said active communications path, said switch having a first terminal coupled to said RF input port, a second terminal coupled to said active communications path, and a third terminal;
   a passive communications path connecting said third terminal of said switch to one of said plurality of RF output ports, wherein said passive communications path does not pass through said power divider network, wherein when power is supplied to said switch, said first terminal of said switch is connected to said second terminal of said switch and when power is not supplied to said switch said first terminal of said switch is connected to said third terminal of said switch; and
   a filter functioning as a MoCA rejection filter and coupled between said power divider network and said RF input port.

2. The bi-directional RF signal amplifier according to claim 1, wherein said switch is a first switch and further comprising:

a second switch located between said passive communications path and said one of said plurality of RF output ports, said second switch having a first terminal coupled to said one of said plurality of RF output ports, a second terminal coupled to an output of said power divider network and a third terminal coupled to said passive communications path, wherein when power is supplied to said second switch, said first terminal of said second switch is connected to said second terminal of said second switch, and when power is not supplied to said second switch, said first terminal of said second switch is connected to said third terminal of said second switch.

3. The bi-directional RF signal amplifier according to claim 2, wherein said active communications path further includes a first diplexer and a second diplexer, and wherein said power amplifier is located between said first diplexer and said second diplexer.

4. The bi-directional RF signal amplifier according to claim 3, wherein said first diplexer has a common port, a high frequency port and a low frequency port, and wherein said second terminal of said switch is directly coupled to said common port of said first diplexer without any intervening circuit element.

5. The bi-directional RF signal amplifier according to claim 4, wherein said second diplexer has a common port, a high frequency port and a low frequency port, and wherein an input to said power amplifier is directly coupled to said high frequency port of said first diplexer and an output of said power amplifier is directly coupled to said high frequency port of said second diplexer.

6. The bi-directional RF signal amplifier according to claim 1, wherein said plurality of RF output ports are formed as female coaxial ports.

7. The bi-directional RF signal amplifier according to claim 2, wherein said filter is coupled between said power divider network and said active communications path.

8. The bi-directional RF signal amplifier according to claim 7, wherein said filter is a first filter, and further comprising:
a second filter functioning as a MoCA rejection filter coupled between said third terminal of said second switch and said third terminal of said first switch.

9. The bi-directional RF signal amplifier according to claim 1, wherein said filter is coupled between said first terminal of said first switch and said RF input port.

10. A bi-directional RF signal amplifier comprising:
a RF input port;
a power divider network having at least one power divider leading to a plurality of outputs from said power divider network;
a plurality of RF output ports, each RF output port coupled to a respective one of said plurality of outputs from said power divider network;
an active communications path connecting said RF input port to said power divider network, said active communications path including a power amplifier;
a switch located between said RF input port and said active communications path, said switch having a first terminal coupled to said RF input port, a second terminal coupled to said active communications path, and a third terminal; and
a passive communications path connecting said RF input port to one of said plurality of RF output ports, wherein when power is supplied to said switch, said first terminal of said switch is connected to said second terminal of said switch and when power is not supplied to said switch, said first terminal of said switch is connected to said third terminal of said switch and said third terminal of said switch is connected to a resistor which is in turn connected to ground.

11. The bi-directional RF signal amplifier according to claim 10, further comprising:
a directional coupler having first, second and third terminals, said first terminal of said directional coupler being connected to said RF input port, said second terminal of said directional coupler being connected to said first terminal of said switch and said third terminal of said directional coupler being connected to said passive communications path.

12. The bi-directional RF signal amplifier according to claim 11, wherein said switch is a first switch and further comprising:
a second switch located between said passive communications path and said one of said plurality of RF output ports, said second switch having a first terminal coupled to said one of said plurality of RF output ports, a second terminal coupled to an output of said power divider network and a third terminal coupled to said passive communications path, wherein when power is supplied to said second switch, said first terminal of said second switch is connected to said second terminal of said second switch, and when power is not supplied to said second switch, said first terminal of said second switch is connected to said third terminal of said second switch.

13. The bi-directional RF signal amplifier according to claim 12, wherein said active communications path further includes a first diplexer and a second diplexer, wherein said first diplexer has a common port, a high frequency port and a low frequency port, wherein said second terminal of said switch is directly coupled to a common port of said first diplexer without any intervening circuit element, wherein said second diplexer has a common port, a high frequency port and a low frequency port, and wherein an input to said power amplifier is directly coupled to said high frequency port of said first diplexer and an output of said power amplifier is directly coupled to said high frequency port of said second diplexer.

14. The bi-directional RF signal amplifier according to claim 12, further comprising:
a filter functioning as a MoCA rejection filter and coupled between said power divider network and said RF input port.

15. The bi-directional RF signal amplifier according to claim 14, wherein said filter is a first filter, wherein said first filter is coupled between said power divider network and said active communications path, and further comprising:
a second filter functioning as a MoCA rejection filter coupled between said third terminal of said second switch and said third terminal of said first switch.

16. The bi-directional RF signal amplifier according to claim 14, wherein said filter is coupled between said first terminal of said first switch and said RF input port.

17. A bi-directional RF signal amplifier comprising:
a RF input port;
a power divider network having at least one power divider leading to a plurality of outputs from said power divider network;
a plurality of RF output ports, each RF output port coupled to a respective one of said plurality of outputs from said power divider network;

an active communications path connecting said RF input port to said power divider network, said active communications path including a power amplifier;
a passive communications path connecting said RF input port to one of said plurality of RF output ports;
a switch located between said one of said RF output ports and said passive communications path, said switch having a first terminal coupled to said one of said RF output ports, a second terminal coupled to one of said outputs from said power divider network, and a third terminal coupled to said passive communications path, wherein when power is supplied to said switch, said first terminal of said switch is connected to said second terminal of said switch and when power is not supplied to said switch, said first terminal of said switch is connected to said third terminal of said switch; and
a directional coupler having first, second and third terminals, said first terminal of said directional coupler being connected to said RF input port, said second terminal of said directional coupler being connected to said active communications path, and said third terminal of said directional coupler being connected to said passive communications path.

18. The bi-directional RF signal amplifier according to claim 17, further comprising:
a first filter, functioning as a MoCA rejection filter, located between said active communications path and said power divider network; and
a second filter, functioning as a MoCA rejection filter, located between said third terminal of said directional coupler and said third terminal of said switch.

19. The bi-directional RF signal amplifier according to claim 17, further comprising:
a filter located between said RF input port and said directional coupler, and filter functioning as a MoCA rejection filter.

* * * * *